United States Patent
Shen et al.

(10) Patent No.: US 8,178,970 B2
(45) Date of Patent: May 15, 2012

(54) STRONG INTERCONNECTION POST GEOMETRY

(75) Inventors: Wen-Wei Shen, Xinzhuang (TW); Chen-Shien Chen, Hsinchu County (TW); Chen-Cheng Kuo, Chu-Pei (TW); Chih-Hua Chen, Jhubei (TW); Ching-Wen Hsiao, Banqiao (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 37 days.

(21) Appl. No.: 12/623,925

(22) Filed: Nov. 23, 2009

(65) Prior Publication Data

US 2011/0068465 A1 Mar. 24, 2011

Related U.S. Application Data

(60) Provisional application No. 61/243,610, filed on Sep. 18, 2009.

(51) Int. Cl.
*H01L 23/488* (2006.01)

(52) U.S. Cl. ........ 257/737; 257/741; 257/773; 257/778; 257/779

(58) Field of Classification Search .................. 257/685, 257/686, 723, 777–780, E21.575–E21.597, 257/E21.627, E21.641, E23.021, E23.063, 257/E27.137, E27.144, E27.161; 438/108, 438/109, 613–617, FOR. 368, FOR. 426
See application file for complete search history.

(56) References Cited

U.S. PATENT DOCUMENTS

| 5,859,472 | A  | * | 1/1999  | DiStefano et al. ............ 257/674 |
|-----------|----|---|---------|---------------------------------------|
| 5,880,017 | A  | * | 3/1999  | Schwiebert et al. .......... 438/613  |
| 5,923,955 | A  | * | 7/1999  | Wong ............................. 438/108 |
| 6,229,220 | B1 | * | 5/2001  | Saitoh et al. .................. 257/780 |
| 6,340,608 | B1 |   | 1/2002  | Chooi et al.                          |
| 6,406,988 | B1 | * | 6/2002  | Chung .......................... 438/612 |
| 6,852,564 | B2 | * | 2/2005  | Ohuchi et al. ................... 438/68 |
| 6,875,638 | B2 | * | 4/2005  | Yoneda et al. ................ 438/125 |
| 7,125,789 | B2 | * | 10/2006 | Tellkamp et al. ............. 438/614 |
| 7,382,049 | B2 | * | 6/2008  | Ho et al. ....................... 257/737 |
| 7,468,316 | B2 | * | 12/2008 | Lee et al. ...................... 438/614 |
| 7,476,564 | B2 |   | 1/2009  | Chen et al.                           |
| 7,569,935 | B1 | * | 8/2009  | Fan .............................. 257/737 |
| 7,598,613 | B2 | * | 10/2009 | Tanida et al. ................. 257/737 |
| 7,674,702 | B1 | * | 3/2010  | Patwardhan et al. ......... 438/612 |
| 7,829,265 | B2 | * | 11/2010 | Kitada et al. ................. 430/311 |
| 2005/0242431 | A1 | * | 11/2005 | Addinall et al. ............. 257/734 |
| 2006/0220259 | A1 | * | 10/2006 | Chen et al. ................... 257/778 |
| 2006/0223313 | A1 |   | 10/2006 | Yoon et al.                           |

(Continued)

OTHER PUBLICATIONS

Ilyas Mohammed et al., Crack Growth-Resistant Interconnects for High-Reliability Microelectronics, Jun. 24, 2008, 2008 Electronic Components and Technology Conference, pp. 1880-1886.*

(Continued)

*Primary Examiner* — Steven Loke
*Assistant Examiner* — Victoria Hall
(74) *Attorney, Agent, or Firm* — Haynes and Boone, LLP

(57) ABSTRACT

A flip-chip packaging assembly and integrated circuit device are disclosed. An exemplary flip-chip packaging assembly includes a first substrate; a second substrate; and joint structures disposed between the first substrate and the second substrate. Each joint structure comprises an interconnect post between the first substrate and the second substrate and a joint solder between the interconnect post and the second substrate, wherein the interconnect post exhibits a width and a first height. A pitch defines a distance between each joint structure. The first height is less than half the pitch.

18 Claims, 4 Drawing Sheets

U.S. PATENT DOCUMENTS

| | | | |
|---|---|---|---|
| 2007/0001277 A1* | 1/2007 | Ichikawa | 257/676 |
| 2007/0222053 A1* | 9/2007 | Wei et al. | 257/686 |
| 2009/0045524 A1* | 2/2009 | Mohammed et al. | 257/777 |
| 2009/0146303 A1* | 6/2009 | Kwon | 257/741 |
| 2010/0007015 A1* | 1/2010 | Gallegos | 257/737 |

OTHER PUBLICATIONS

Bahareh Banijamali et al., Reliability of Fine-Pitch Flip-Chip Packages, May 2009, 2009 Electronic Compoents and Technology Conference, pp. 293-300.*

"The Thermal Copper Pillar Bump: Enabling Improved Semiconductor Performance Without Sacrificing Efficiency", Nextreme Thermal Solutions, Jan. 9, 2008, 12 pages.

"Reliability of uPILR Fine-Pitch Flip-Chip Packages", Presented at: 59th Electronic Components and Technology Conference (ECTC), San Diego, CA, May 27, 2009, 19 pages.

Neha M. Patel et al., "Flip-Chip Packaging Technology for Enabling 45nm Products", Intel Technology Journal, vol. 12, Issue 02, Published Jun. 17, 2008, ISSN 1535-864X, pp. 145-157.

* cited by examiner

Strong Interconnection Post Geometry

STRONG INTERCONNECTION POST GEOMETRY

PRIORITY DATA

The application claims priority to Provisional Application Ser. No. 61/243,610 filed on Sep. 18, 2009, entitled "Strong Interconnection Post Geometry", the entire disclosure of which is incorporated herein by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, interconnection and packaging issues have lead to the need for not only fast and efficient ICs, but also equally fast and reliable packaging. An exemplary package-chip system is referred to as "flip-chip" technology, where an IC is mounted on a package. This system can involve placing solder bumps on a die or IC, flipping the IC over, aligning the IC with contact pads on a substrate, and reflowing the solder balls to establish bonding between the IC and the substrate. The solder balls act as an interconnect between the IC and the substrate. It has been observed that conventional interconnect geometry exhibits bump fatigue and less than desirable joint reliability. A need therefore exists to address these interconnect geometry issues.

SUMMARY

The present disclosure provides for many different embodiments. An exemplary flip-chip packaging assembly includes a first substrate; a second substrate; and joint structures disposed between the first substrate and the second substrate. Each joint structure comprises an interconnect post between the first substrate and the second substrate and a joint solder between the interconnect post and the second substrate, wherein the interconnect post exhibits a width and a first height. A pitch defines a distance between each joint structure. The first height is less than half the pitch.

An exemplary integrated circuit device includes a semiconductor substrate comprising bonding pads; and bump structures formed overlying the semiconductor substrate and electrically connected to the bonding pads, wherein a pitch defines a distance between each bump structure. Each bump structure comprises a copper post exhibiting a width and a height, wherein the height is less than half the pitch.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
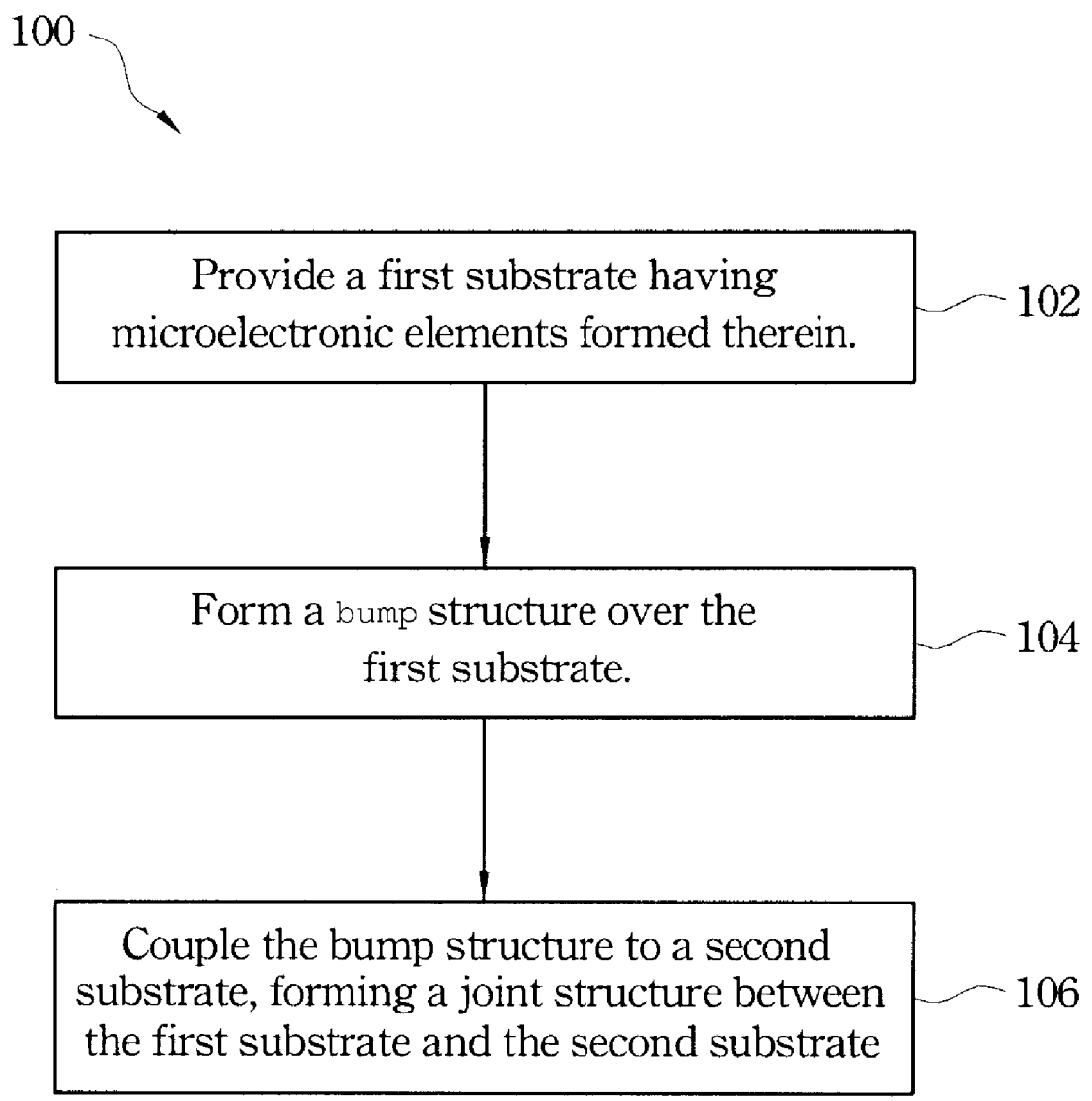
FIG. 1 is a flow chart of a method for packaging an integrated circuit device according to aspects of the present disclosure.

The present disclosure relates generally to integrated circuit packaging processes, and more particularly, to interconnect structures utilized for flip-chip packaging processes.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1, 2, and 3A-3B, a method 100, an integrated circuit device 200 (alternatively referred to as a semiconductor device), a bump structure 300, and a packaging substrate 400 are collectively described below. It is understood that additional steps can be provided before, during, and after the method 100, and some of the steps described below can be replaced or eliminated, for additional embodiments of the method. It is further understood that additional features can be added in the integrated circuit device 200, bump structure 300, and packaging substrate 400, and some of the features described below can be replaced or eliminated, for additional embodiments of the integrated circuit device 200, bump structure 300, and packaging substrate 400.

Figure 2:
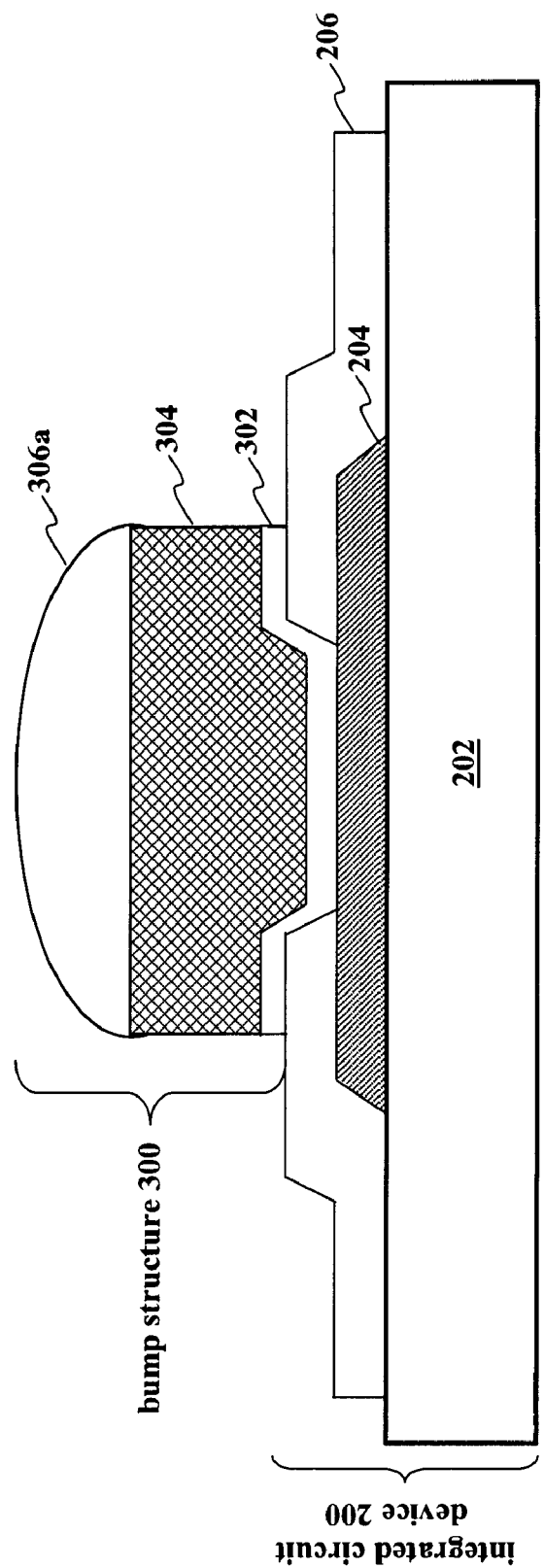
FIG. 2 is a cross-sectional view of an embodiment of an integrated circuit device having a bump structure disposed thereover according to aspects of the present disclosure.

Referring to FIGS. 1 and 2, at block 102 of the method 100, the integrated circuit device 200, which may be referred to as a first substrate, includes a substrate 202 having microelectronic elements formed therein is provided. The substrate 202 is a semiconductor substrate comprising silicon. Alternatively, the substrate 202 comprises an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multilayer compound semiconductor structure.

The substrate 202 may include various doped regions depending on design requirements as known in the art (e.g., p-type wells or n-type wells). The doped regions are doped with p-type dopants, such as boron or $BF_2$; n-type dopants, such as phosphorus or arsenic; or combinations thereof. The doped regions may be formed directly on the substrate 202, in a P-well structure, in a N-well structure, in a dual-well structure, or using a raised structure. The substrate 202 may further include various active regions, such as regions configured for an N-type metal-oxide-semiconductor (NMOS) transistor device and regions configured for a P-type metal-oxide-semiconductor (PMOS) transistor device.

The substrate 202 may further comprise a plurality of isolation features (not shown), such as shallow trench isolation (STI) features or local oxidation of silicon (LOCOS) features. The isolation features may define and isolate the various microelectronic elements (not shown). Examples of the various microelectronic elements that may be formed in the substrate 202 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

The integrated circuit device 200 may further include an interconnect structure formed over the substrate 202. For example, the interconnect structure can include inter-layer dielectric (ILD) layers, inter-metal dielectric (IMD) layers, and metallization layers. The ILD and/or IMD layers in the interconnect structure include low-k dielectric materials, un-doped silicate glass (USG), silicon nitride, silicon oxynitride, or other suitable materials. The dielectric constants (k value) of the low-k dielectric materials may be less than about 3.9, or less than about 2.8. The metallization layers may form metal lines in the interconnect structure, which may be formed of copper or copper alloys. One skilled in the art will realize the formation details of the interconnect structure.

The integrated circuit device 200 further includes a bonding pad 204. The bonding pad 204 is a top metallization layer formed in a top-level inter-layer dielectric layer, which is a portion of conductive routes and has an exposed surface treated by a planarization process, such as a chemical mechanical polishing (CMP), if necessary. Suitable materials for the bonding pad 204 include, but are not limited to, for example copper, aluminum, copper alloy, or other mobile conductive materials, although it may also be formed of, or include, other materials, such as copper, silver, gold, nickel, tungsten, alloys thereof, and/or multi-layers thereof. The profile of the bonding pad 204 may have any suitable step height in order to achieve adequate bonding properties. A passivation layer 206 is provided on the substrate 202 and patterned to expose a portion of the bonding pad 204. The passivation layer 206 may be formed of a non-organic material selected from un-doped silicate glass (USG), silicon nitride, silicon oxynitride, silicon oxide, and combinations thereof. Alternatively, the passivation layer 206 may be formed of a polymer layer, such as an epoxy, polyimide, benzocyclobutene (BCB), polybenzoxazole (PBO), and the like. Other relatively soft, often organic, dielectric materials can also be used.

At block 104, a bump structure 300 is formed over the integrated circuit device 200. As illustrated in FIG. 2, the bump structure 300 is formed over an exposed portion of the bonding pad 204. The bump structure 300 is a flip-chip assembly, which provides direct electrical connection of a face-down integrated circuit device (i.e., integrated circuit device 200) onto another substrate, such as a board or printed circuit board (PCB). In the present embodiment, the bump structure 300 includes an under bump metallization (UBM) layer 302, an interconnect post 304, and a solder 306a formed by any suitable process.

The UBM layer 302 is formed over the passivation layer 206 and the exposed portion of the bonding pad 204. In an embodiment, the UBM layer 302 includes a diffusion barrier layer and/or a seed layer. The diffusion barrier layer may also be referred to as a glue layer. The diffusion barrier layer may be formed of titanium, although it may also be formed of other materials, such as titanium nitride, tantalum, tantalum nitride, or the like. The formation methods include physical vapor deposition (PVD) or sputtering. The seed layer may be a copper seed layer formed on the diffusion barrier layer using PVD or sputtering. The seed layer may be formed of copper alloys that include silver, chromium, nickel, tin, gold, or combinations thereof. In one embodiment, the UBM layer 302 is a Cu/Ti layer.

The interconnect post 304 and solder 306 may similarly comprise any suitable material. In the present example, the interconnect post 304 is a metal post, which may be formed of a conductive material with solder wettability. For example, the interconnect post 304 is formed of copper, which is referred to as a copper post (or copper bump). The solder layer 306a is formed on the interconnect post 304. The solder layer 306a may be comprise Sn, SnAg, Sn—Pb, SnAgZn, SnZn, SnBi—In, Sn—In, Sn—Au, SnPb, SnCu, SnZnIn, or SnAgSb, etc.

Figure 3A:
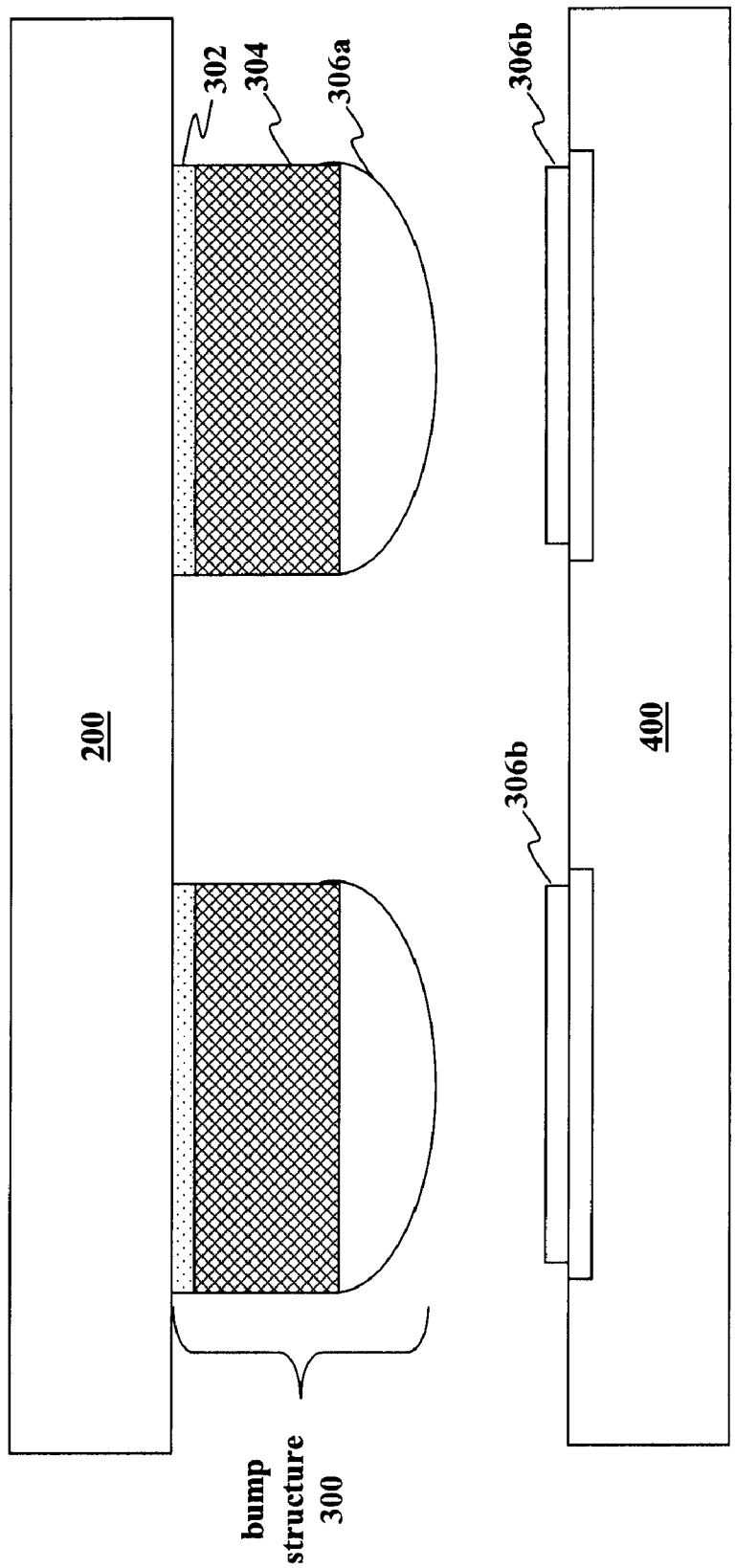
FIGS. 3A-3B are various cross-sectional views of embodiments of an integrated circuit device packaging process during various fabrication stages according to the method of FIG. 1.
Figure 3B:
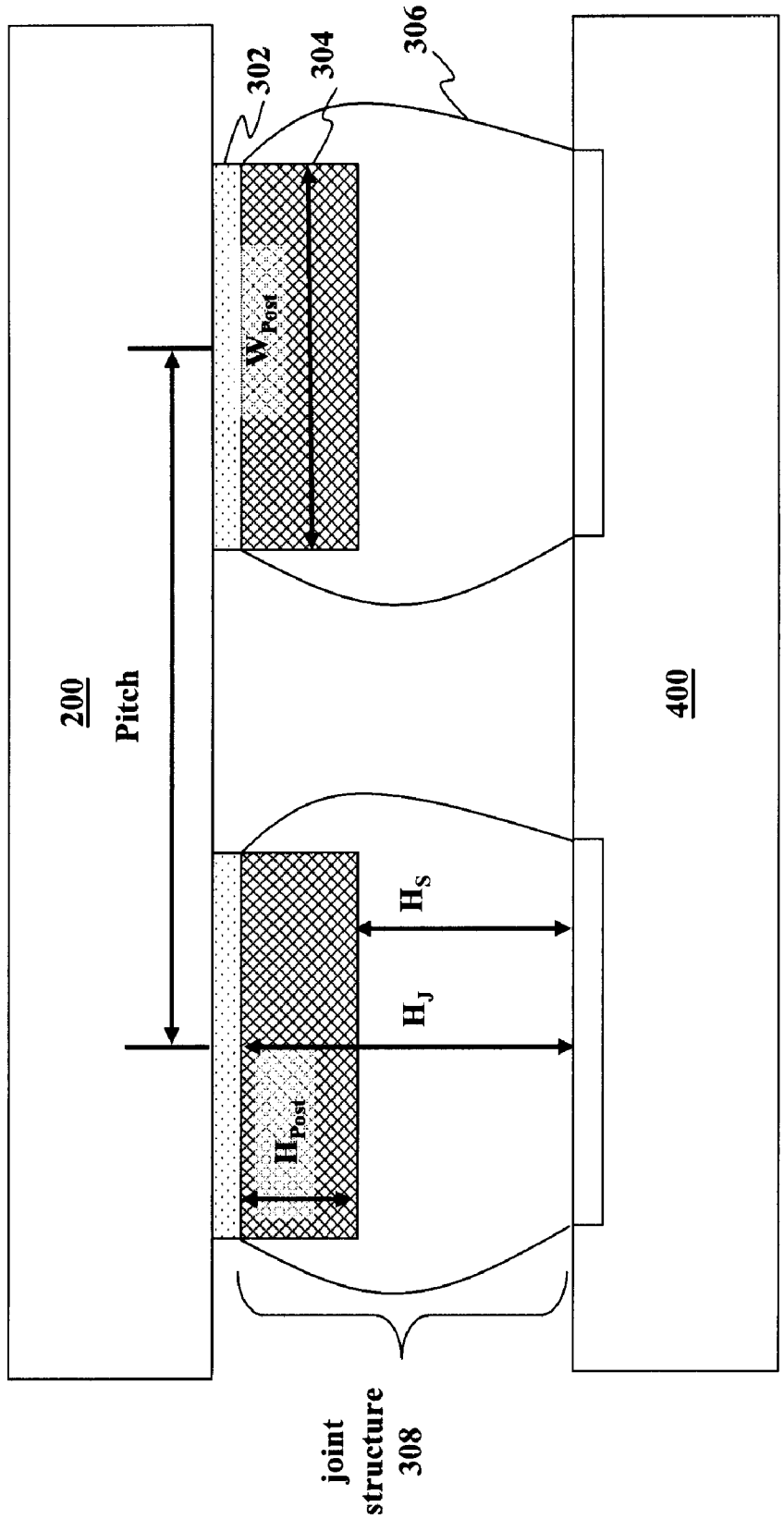

Referring to FIGS. 1 and 3A-3B, at block 106, the bump structure is coupled to a second substrate, forming a joint structure between the first substrate and the second substrate. More particularly, the bump structure 300 is coupled to a second substrate 400, forming a joint structure 308 between the integrated circuit device 200 (also referred to as the first substrate) and the second substrate 400. As illustrated, the integrated circuit device (first substrate) 200 having the bump structure 300 formed thereon is flipped upside down and brought into contact with the second substrate 400. The second substrate 400 may be a package substrate, board (e.g., a print circuit board (PCB)), or other suitable substrate.

The bump structure (or bump structures) 300 contact the second substrate 400 at various conductive attachment points, for example, another solder layer 306b on contact pads and/or conductive traces, forming the joint structure 308 between the first substrate 200 and the second substrate 400. When the bump structure 300 is coupled to the second substrate 400, the joined solder layers 306a, 306b may be referred to as a joint solder 306. An exemplary coupling process includes a flux application, chip placement, reflow of chip joints, and cleaning of flux residue. The integrated circuit device (first substrate) 200, joint structure 308, and second substrate 400 may be referred to as a packaging assembly, or in the present embodiment, a flip-chip packaging assembly.

FIG. 3B designates several dimensions/characteristics to define the packaging assembly geometry, particularly the bump structure 300 and joint structure 308 geometry. The joint structure 308 includes the interconnect post 304 and solder layers 306a, 306b (referred to as the joint solder 306). The dimensions/characteristics include a height ($H_J$) of the joint structure 308, a height ($H_{Post}$) of the interconnect post 304, a width ($W_{Post}$) of the interconnect post 304, and a height ($H_S$) of the joint solder 306. The dimensions/characteristics further include a pitch (or bump pitch), which defines a distance between a first joint structure 308 and a second joint structure 308. In the present embodiment, the pitch is measured from the center of the joint structures, however, other configurations are contemplated, for example, measuring the pitch from ends of the joint structures. The joint structure 308 may exhibit any suitable joint structure height ($H_J$), interconnect post height ($H_{Post}$), interconnect post width ($W_{Post}$), and joint solder height ($H_S$).

It has been observed that conventional joint structure dimensions/characteristics exhibit bump fatigue, particularly if the joint structure height is too high. Accordingly, the present embodiment exhibits dimensions/characteristics that provide increased joint reliability and reduce bump fatigue. For example, the interconnect post height ($H_{Post}$) and pitch are related to one another by the following relationship:

$$\text{interconnect post height} < 0.5*\text{pitch}.$$

Ensuring that the interconnect post height is less than half the pitch can provide increased joint reliability and reduce bump fatigue. The interconnect post height ($H_{Post}$) may further be defined by the following relationship:

$$0.21*\text{pitch} < \text{interconnect post height} < 0.24*\text{pitch}.$$

Thus, a ratio of the interconnect post height and pitch may be between 0.24 and 0.21.

Further geometry specifications include the interconnect post width (WPost) and pitch related to one another by the following relationship:

$$\text{interconnect post width} > 0.6*\text{pitch}.$$

The joint solder height (HS) and joint structure height (HJ) of the joint structure 308 may also be tuned, wherein the joint structure height and joint solder height exhibit a ratio of:

$$\text{joint solder height/joint structure height} > 0.44.$$

An exemplary joint structure geometry includes a pitch ranging from about 120 µm to about 180 µm; a joint structure height ($H_J$) ranging from about 30 µm to about 90 µm; an interconnect post height ($H_{Post}$) ranging from about 30 µm to about 50 µm; a joint solder height ($H_S$) ranging from about 40 µm to about 60 µm; and an interconnect post width ($W_{Post}$) ranging from about 60 µm to about 100 um. The interconnect post height ($H_{Post}$), joint structure height ($H_J$), and a joint solder height ($H_S$) may alternatively be referred to as a first height, a second height, and a third height. The exemplary joint structure geometry advantageously increases joint reliability and reduces bump fatigue issue. It is understood that different embodiments may have different advantages, and that no particular advantage is necessarily required of any embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A flip-chip packaging assembly comprising:
   a first substrate;
   a second substrate;
   joint structures disposed between the first substrate and the second substrate, wherein a pitch defines a distance between two adjacent joint structures;
   wherein each joint structure comprises an interconnect post between the first substrate and the second substrate and a joint solder between the interconnect post and the second substrate;
   wherein the interconnect post has a width and a first height, the joint structure has a second height, and the joint solder has a third height, wherein the first height is greater than the third height; and
   wherein the first height and pitch are related to one another by the following relationship:

$$\text{first height} < 0.5*\text{pitch; and}$$

wherein a ratio between the second height and the third height is represented by:

$$\text{third height/second height} > 0.44.$$

2. The flip-chip packaging assembly of claim 1 wherein the width and pitch are related to one another by the following relationship:

$$\text{width} > 0.6*\text{pitch}.$$

3. The flip-chip packaging assembly of claim 1 further comprising the first height and pitch related to one another by the following relationship:

$$0.21*\text{pitch} < \text{first height} < 0.24*\text{pitch}.$$

4. The flip-chip packaging assembly of claim 1 wherein the interconnect post comprises a height ranging from about 30 µm to about 50 µm.

5. The flip-chip packaging assembly of claim 1 wherein the interconnect post comprises copper.

6. The flip-chip packaging assembly of claim 1 wherein joint solder comprises a third height ranging from about 40 µm to about 60 µm.

7. The flip-chip packaging assembly of claim 1 wherein the joint structure comprises a second height ranging from about 30 µm to about 90 µm.

8. The flip-chip packaging assembly of claim 1 further comprising an under-bump metallization (UBM) layer between the joint structure and the first substrate.

9. The flip-chip packaging assembly of claim 8 wherein the UBM layer comprises titanium, copper, or combinations thereof.

10. A integrated circuit, comprising:
    a first semiconductor substrate comprising bonding pads;
    a second semiconductor substrate; and
    bump structures formed overlying the first semiconductor substrate and electrically connected to the bonding pads, wherein a pitch defines a distance between two adjacent bump structures;
    wherein each bump structure has a height extending from the first substrate to the second substrate and comprises a copper post and a joint solder, the copper post having a width and a height and a ratio of the height of the copper post to the pitch is from about 0.24 to about 0.21, wherein the joint solder has a height that is less than the height of the copper post, and wherein a ratio of the height of the joint solder to the height of the bump structure is greater than 0.44.

11. The integrated circuit of claim 10 wherein the width is greater than 0.6*pitch.

12. The integrated circuit of claim 10 wherein the height of the copper post ranges from about 30 μm to about 50 μm.

13. A packaging assembly comprising:
a first substrate and a second substrate;
joint structures coupled between the first substrate and the second substrate, the joint structures comprising an interconnect post and a joint solder, wherein a pitch defines a distance between two adjacent joint structures;
wherein each of the joint structures comprises a first height, the interconnect post comprises a second height, and the joint solder comprises a third height, wherein the second height is greater than the third height; and
a ratio of the third height to the first height is greater than 0.44, and a ratio of the second height to the pitch is from about 0.21 to about 0.24.

14. The packaging assembly of claim 13 wherein the interconnect post is electrically connected to a bonding pad of the first substrate.

15. The packaging assembly of claim 14 wherein the joint solder is disposed between the interconnect post and the second substrate.

16. The packaging assembly of claim 14 wherein an under-bump metallization layer is disposed between the bonding pad of the first substrate and the interconnect post.

17. The flip-chip packaging assembly of claim 1, wherein each joint structure has only one interconnect post between the first substrate and the second substrate.

18. The flip-chip packaging assembly of claim 1, wherein the interconnect post is coupled to the first substrate and spaced apart from the second substrate by only the joint solder.

* * * * *